(12) United States Patent
Potter et al.

(10) Patent No.: US 8,933,746 B1
(45) Date of Patent: Jan. 13, 2015

(54) PARALLEL FET SOLID STATE RELAY UTILIZING COMMUTATION FETS

(71) Applicant: Astronics Advanced Electronic Systems Corp., Kirkland, WA (US)

(72) Inventors: Frederick J. Potter, Trumbauersville, PA (US); Raymond Moravec, Redmond, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 58 days.

(21) Appl. No.: 13/938,558

(22) Filed: Jul. 10, 2013

(51) Int. Cl.
*H03K 17/687* (2006.01)
(52) U.S. Cl.
CPC .................................... *H03K 17/687* (2013.01)
USPC .......................................... 327/427; 327/419
(58) Field of Classification Search
None
See application file for complete search history.

(56) References Cited

U.S. PATENT DOCUMENTS

| 3,720,848 | A | * | 3/1973 | Schmidt, Jr. | 327/391 |
| 5,309,078 | A | * | 5/1994 | Cameron | 318/811 |
| 5,544,038 | A | * | 8/1996 | Fisher et al. | 363/147 |
| 6,300,734 | B1 | * | 10/2001 | Franke et al. | 318/286 |
| 6,853,232 | B2 | * | 2/2005 | Sander et al. | 327/312 |
| 7,067,766 | B2 | | 6/2006 | Saccon et al. | |
| 7,084,462 | B1 | | 8/2006 | Warnock et al. | |
| 7,889,477 | B2 | * | 2/2011 | Neubarth et al. | 361/212 |
| 8,400,205 | B2 | | 3/2013 | Foroudi | |

FOREIGN PATENT DOCUMENTS

WO            9013181 A1    11/1990

* cited by examiner

*Primary Examiner* — Cassandra Cox
(74) *Attorney, Agent, or Firm* — Wiggin and Dana LLP; Jonathan D. Hall; Gregory S. Rosenblatt

(57) ABSTRACT

A solid state relay circuit is disclosed, containing a first and second group of FETs, the groups being connected in parallel. The first FET group contains commutation FETs capable of handling the commutation load of the circuit. The second FET group contains secondary FETs of lower resistance than the commutation FETs. The circuit is configured such that, when the circuit is activated, the commutation FETs are driven on before the secondary FETs. The circuit is also configured such that, when the circuit is deactivated, the commutation FETs are driven off only after the secondary FETs.

8 Claims, 8 Drawing Sheets

US 8,933,746 B1

PARALLEL FET SOLID STATE RELAY UTILIZING COMMUTATION FETS

FIELD OF THE DISCLOSURE

The subject matter of the present disclosure generally relates to solid state relay circuits, and more particularly relates to solid state relay circuits utilizing parallel field effect transistors.

BACKGROUND OF THE DISCLOSURE

Field effect transistors (FETs) are transistors in which the voltage at a gate is used to create a field that either facilitates or prevents conduction between a source terminal and a drain terminal. Multiple FETs connected in parallel have previously been utilized in electrical switch devices to reduce the overall resistance of such devices. However, such designs had the disadvantage that one of the FETs connected in parallel would be the first to experience the entire commutation stress of the switch upon activation and likewise one of the FETs would experience the entire commutation stress of the switch upon deactivation. Therefore, each FET had to be sufficiently large to handle the entire commutation stress and the reduction in resistance that could be achieved through the use of parallel FETs was limited.

The subject matter of the present disclosure is directed to overcoming, or at least reducing the effects of, one or more of the problems set forth above.

BRIEF SUMMARY OF THE DISCLOSURE

Disclosed is a solid state relay circuit in which at least two groups of field effect transistors, connected in parallel, are utilized. The first group contains at least one commutation FET capable of handling the commutation stress of the relay circuit. The second group contains at least one secondary FET which has less resistance than the commutation FETs contained in the aforementioned first group. The secondary FETs may be sized smaller than the commutation FETs. A first gate and a second gate are connected respectively to the first and second FET groups. Together, these gates operate such that the commutation FETs are driven on before the secondary FETs when the circuit is activated, and are driven off after the secondary FETs when the circuit is deactivated.

The disclosed relay circuit has several advantages. It has a lower overall resistance during solid state operation than would a comparative circuit in which each FET is sized to handle the commutation load. Also, the aforementioned operation of the gates causes the secondary FETs to be protected from possible damage, such as by overheating, that may otherwise occur from the secondary FETs bearing the commutation stress during activation or deactivation of the circuit.

The details of one or more embodiments of the invention are set forth in the accompanying drawings and descriptions below. The foregoing summary is not intended to summarize each potential embodiment or every aspect of the disclosure.

BRIEF DESCRIPTION OF THE DRAWINGS

The foregoing summary, preferred embodiments, and other aspects of subject matter of the present disclosure will be best understood with reference to a detailed description of specific embodiments, which follows, when read in conjunction with the accompanying drawings, in which.

Like reference numbers and designations in the various drawings indicate like elements.

DETAILED DESCRIPTION OF THE DISCLOSURE

Figure 1:
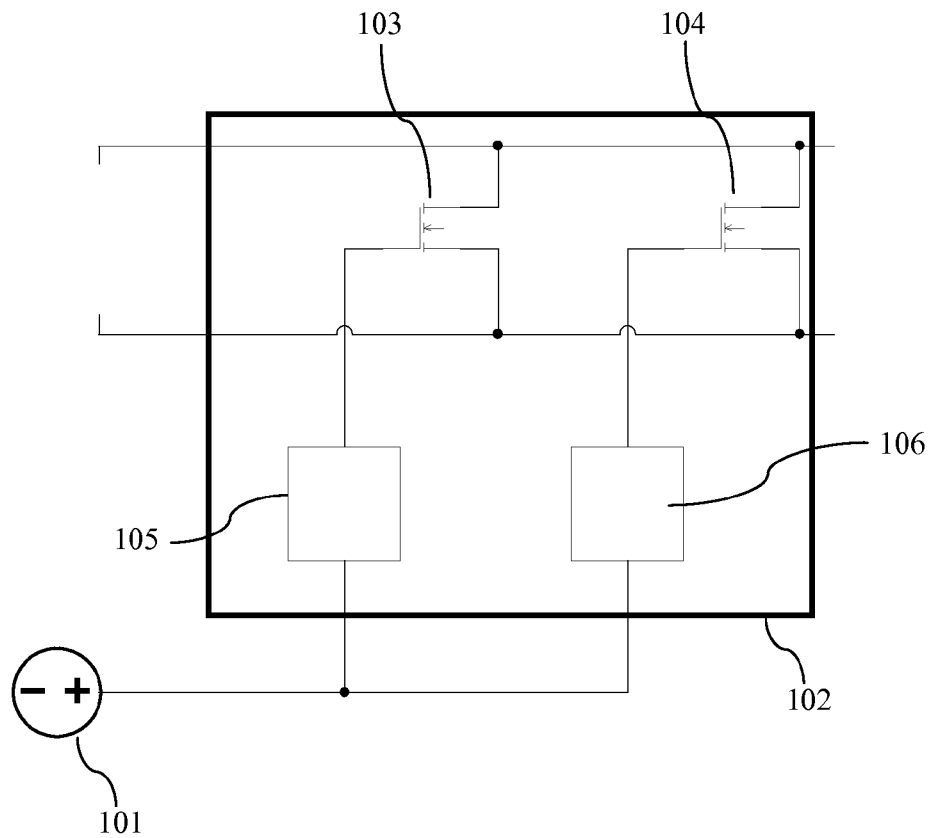
FIG. 1 is a diagram of a first embodiment.

FIG. 1 is a diagram of a basic embodiment. Power source 101 provides power to FET unit 102. Commutation FET 103 is connected in parallel with secondary FET 104 to form a solid state relay circuit. Secondary FET 104 has a lower resistance and is smaller than FET 103. The circuit includes first gate drive 105 and second gate drive 106. First gate drive 105 and second gate drive 106 together ensure that, when commutation FET 103 and secondary FET 104 are activated, commutation FET 103 is driven on before secondary FET 104. First gate drive 105 and second gate drive 106 also ensure that, when commutation FET 103 and secondary FET 104 are deactivated, commutation FET 103 is driven off only after secondary FET 104.

Figure 2:
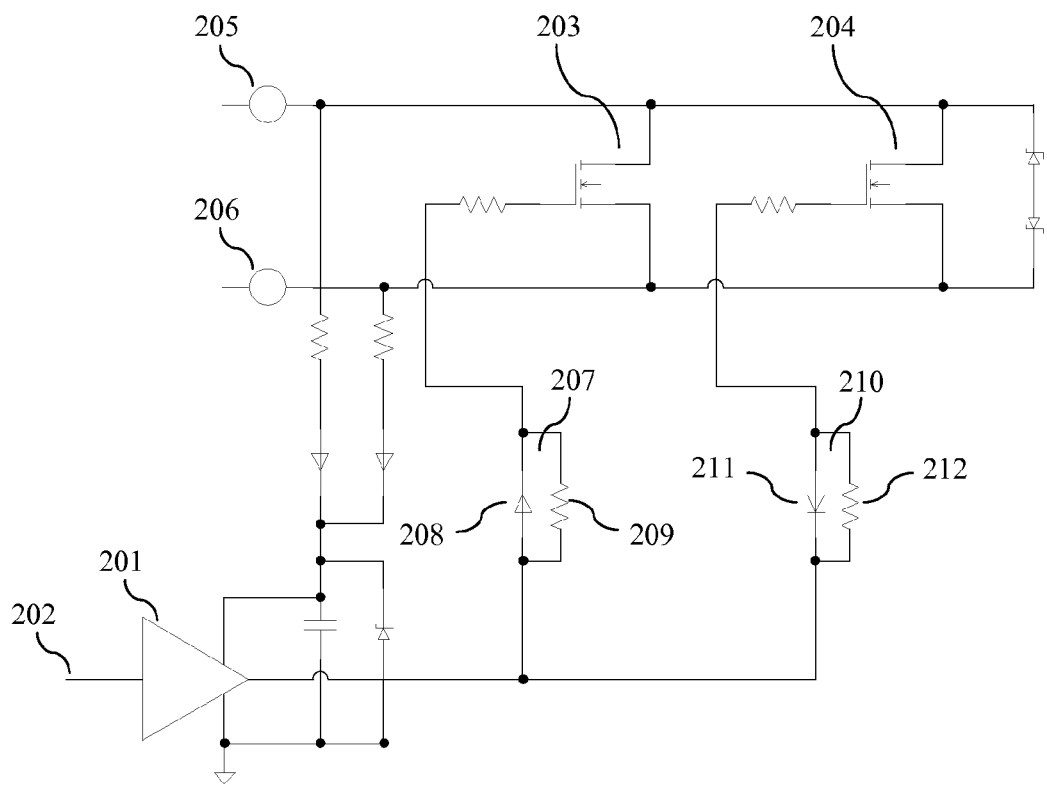
FIG. 2 is a schematic of an embodiment relay circuit.

FIG. 2 is a schematic of an embodiment having two FETs. Driver 201 provides power to the relay circuit and receives on/off commands along line 202. Commutation FET 203 and secondary FET 204 are connected in parallel to driver 201 and first terminal 205 and second terminal 206. First gate drive 207 includes first diode 208 and first resistor 209. Second gate drive 210 includes second diode 211 and second resistor 212. Secondary FET 204 is smaller and has a lower resistance than commutation FET 203. When the depicted relay circuit is in an active, steady-state condition, the lower resistance of secondary FET 204 in comparison to commutation FET 203 produces a lower resistance for the overall relay than if secondary FET 204 was replaced with an FET of the same resistance and size as commutation FET 203. When the relay circuit is in an off condition and an "on" command is received along line 202, driver 201 supplies power to the circuit. First gate drive 207 allows commutation FET 203 to quickly become active, thus allowing commutation FET 203 to shoulder the entire commutation stress of the circuit initially, while second gate drive 208 delays the activation of secondary FET 204, ensuring secondary FET 204 need not endure the full commutation stress. When an off command is received along 202, driver 201 ceases to supply power to the circuit. Second gate drive 210 allows secondary FET 204 to quickly enter a deactivated state while first gate drive 207 delays the deactivation of commutation FET 203 such that commutation FET 203 tolerates the full commutation stress of the circuit during deactivation. The aforementioned operation of the circuit allows for a relatively lower resistance during steady state operation while simultaneously allowing for the use and protection of a smaller secondary FET.

Figure 3:
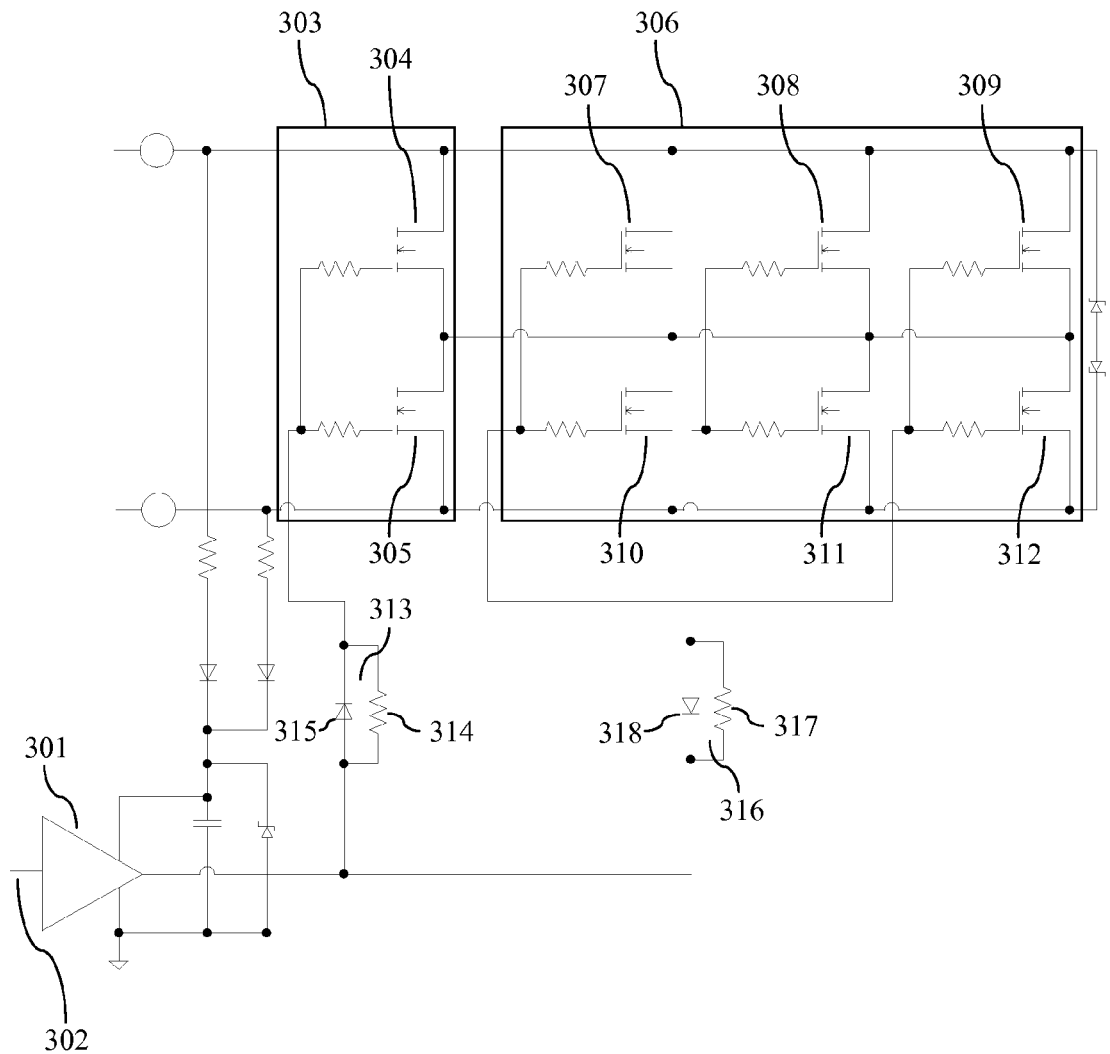
FIG. 3 is a schematic of an embodiment having multiple commutation FETs and multiple secondary FETs formed into a first and second FET group.

FIG. 3 is a schematic of an embodiment including a plurality of commutation FETs and a plurality of secondary FETs. Driver 301 provides power to the relay circuit and receives on/off commands along line 302. Commutation FET group 303 includes first commutation FET 304 and second commutation FET 305, each FET being sufficient to handle the full commutation load of the circuit. Alternatively, commutation FET group 303 could include any suitable number of commutation FETs. Secondary FET group 306 includes secondary FETs 307, 308, 309, 310, 311 and 312. Alternatively, secondary FET group can include any suitable number of secondary FETs. Each FET of secondary FET group 306 has a lower resistance than every FET of commutation FET group 303.

When the relay circuit is in an "off" condition and an "on" command is received along line 302, driver 301 supplies power to the circuit. When this occurs, first gate drive 313, which contains a first resistor 314 and a first diode 315, allows commutation FET group 303 to quickly become active and to shoulder the entire commutation stress of the circuit. At the same time, second gate drive 316, which contains second resistor 317 and second diode 318, delays the activation of secondary FET group 306. This operation protects the FETs of secondary FET group 306 from experiencing the entire commutation stress of the circuit. Rather, secondary FET group 306 is activated after commutation FET group 303. Once activated, the utilization of lower-resistance secondary FET group 306 allows the overall circuit to have a lower resistance than if only commutation FET group 303 was present in the circuit.

When the relay circuit is in an "on" condition and an "off" command is received along line 302, drive 301 cuts the supply of power to the circuit. When this occurs, first gate drive 313 delays the deactivation of commutation FET group 303 while second gate drive 316 allows the immediate deactivation of secondary FET group 306. Therefore, during the deactivation of the circuit the secondary FETs are deactivated before the commutation FETs, ensuring that the secondary FETs do not bear the full commutation stress of the circuit.

Figure 4:
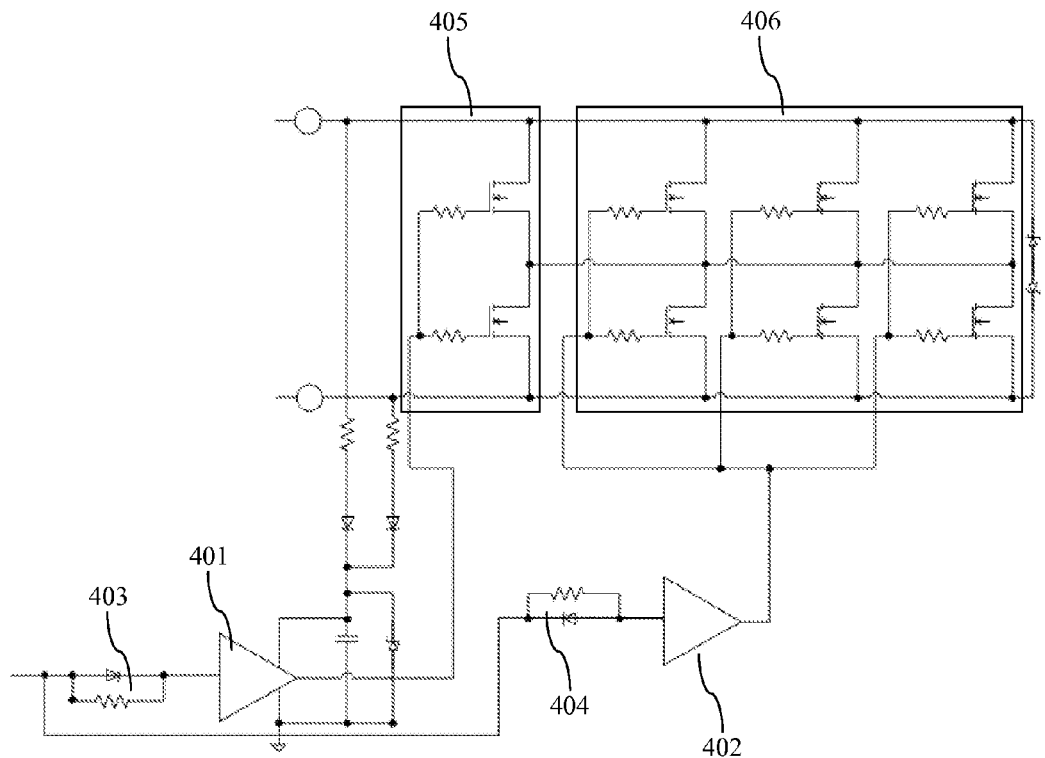
FIG. 4 is a schematic of another embodiment having dual drivers.

FIG. 4 is a schematic of an embodiment having dual drivers. The circuit includes first driver 401 and second driver 402, first gate drive 403 and second gate drive 404, commutation FET group 405 and secondary FET group 406. In this configuration, commutation FET group 405 takes the activation and deactivation current surges and the secondary FETs carry only the smaller steady state current. The commutation FETs also carry part of the steady state current, in an amount depending on the FET $R_{DS(on)}$ rating, where $R_{DS(on)}$ is the drain-to-source resistance when the FET is in a steady "on" condition.

Figure 5:
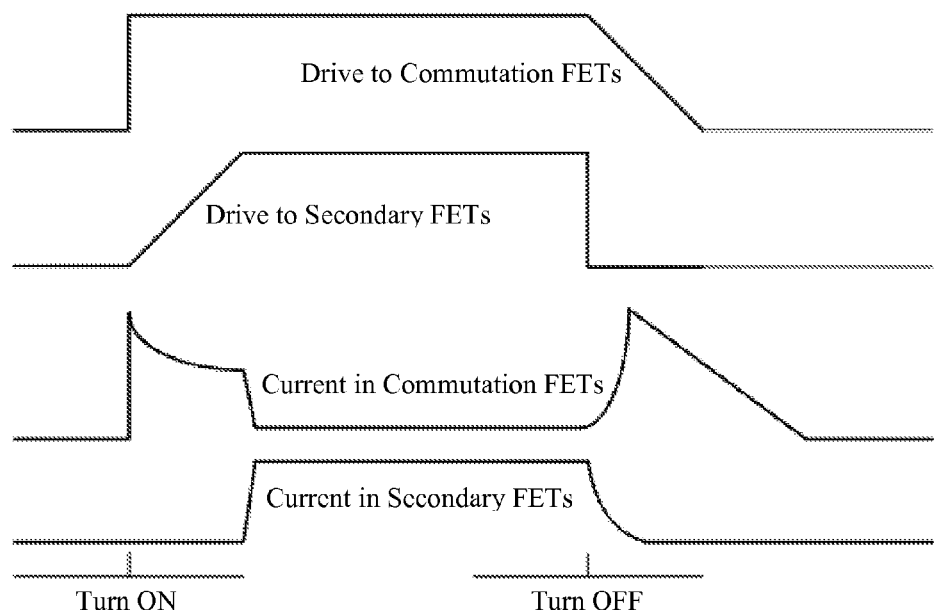
FIG. 5 is an explanatory graph demonstrating the drive and current to and in commutation and secondary FETs of the embodiment of FIG. 4.

FIG. 5 is a demonstrative graph of the drive to and current in the commutation and secondary FETs of the relay circuit of FIG. 4. In an initial, deactivated state, there is no drive to or current in any of the FETs. When activation occurs, the commutation FETs experience an immediate spike in their received drive and amperage while the secondary FETs see a gradual increase in received drive and a delayed increase in amperage. During steady state operation, the small FETs carry the majority of the amperage in the relay circuit and the circuit is able to operate at a lower overall resistance than if the secondary FETs had been similarly sized to the commutation FETs. When deactivation occurs, the drive to the secondary FETs immediately drops and the current in the secondary FETs drops quickly. The drive to the commutation FETs drops gradually, while the amperage in the commutation FETs increases initially as these FETs handle the commutation stress in the circuit, then drops gradually after the secondary FETs no longer experience amperage.

Figure 6:
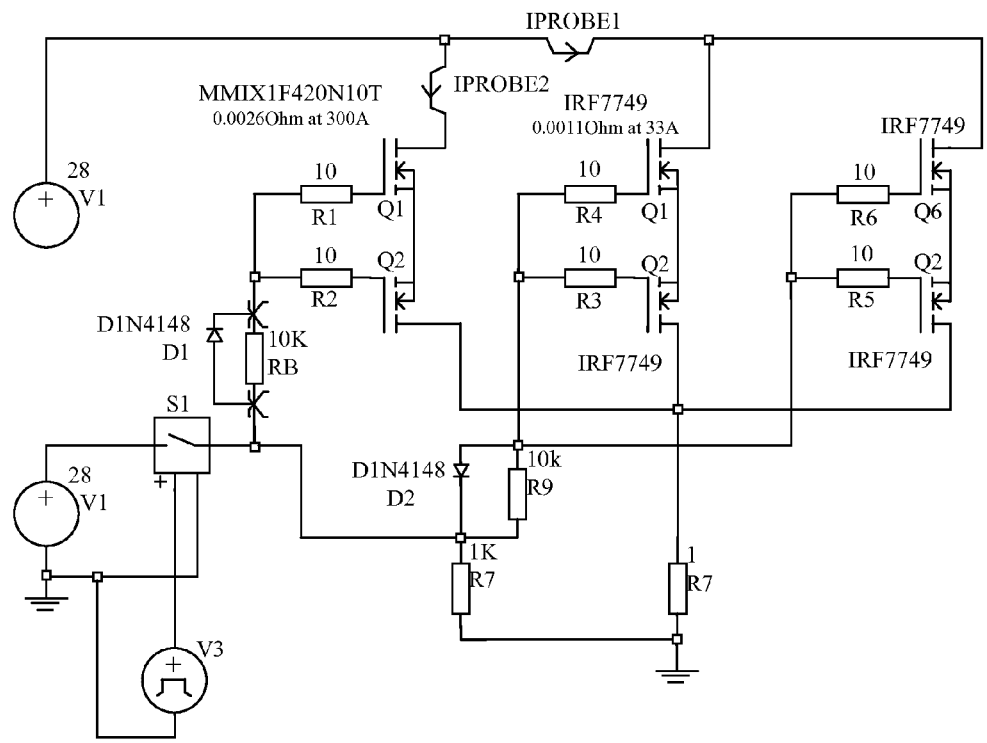
FIG. 6 is a schematic of a simulated embodiment.

FIG. 6 is a schematic of a simulated embodiment.

Figure 7:
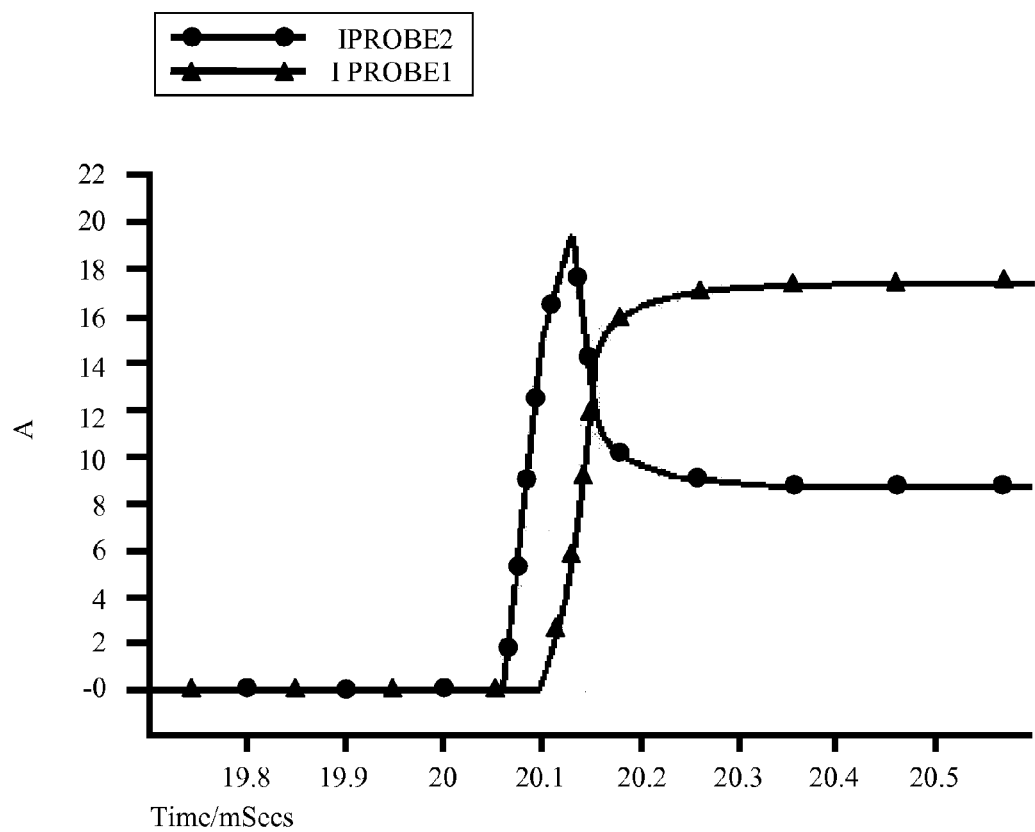
FIG. 7 is a graph of amperage as a function of time for the simulated embodiment of FIG. 6 during circuit activation.

FIG. 7 is a graph of amperage as a function of time during the activation of the simulated circuit of FIG. 6. Probe 1 measures the amperage in the secondary FETs while Probe 2 measures the amperage in the commutation FETs. During activation, the commutation FETs of the relay circuit shoulder the commutation stress while the activation of the secondary FETs is delayed. In a steady state operation, the secondary FETs, which have lower resistance than the commutation FETs, carry a larger amperage than the commutation FETs.

Figure 8:
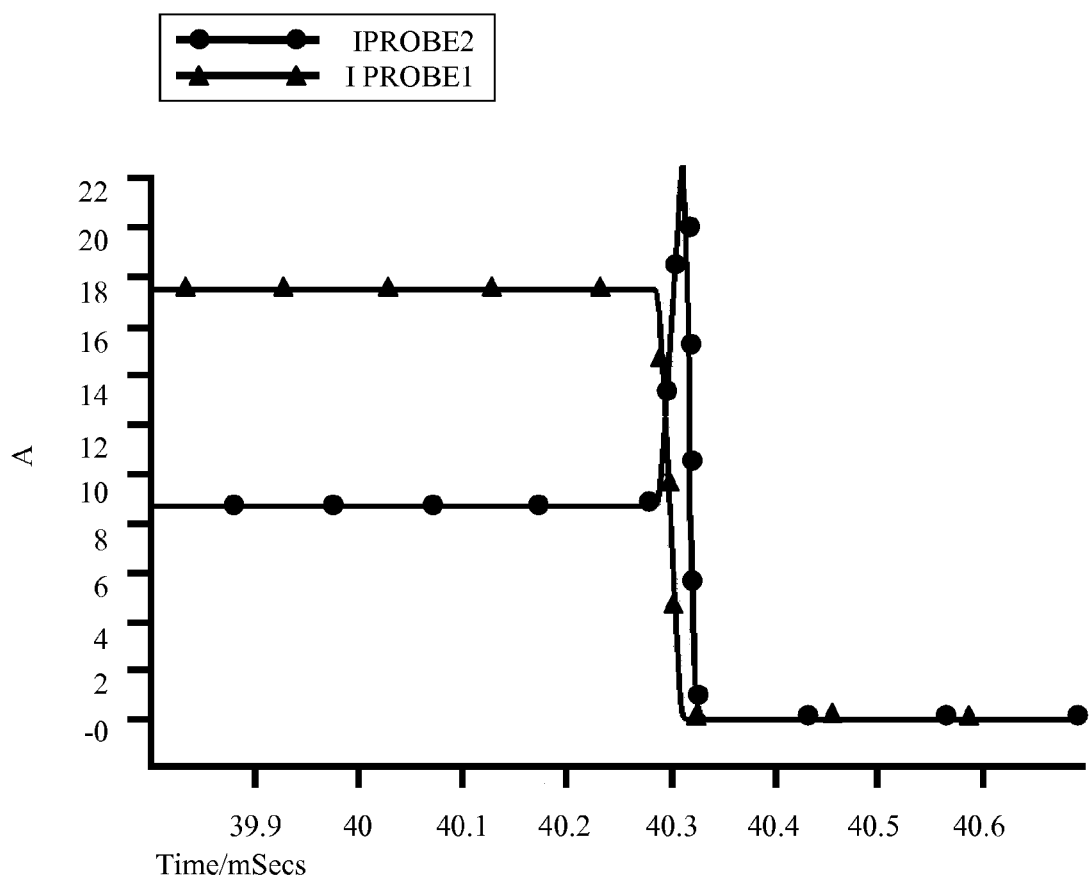
FIG. 8 is a graph of amperage as a function of time for the simulated embodiment of FIG. 6 during circuit deactivation.

FIG. 8 is a graph of amperage as a function of time during the deactivation of the simulated circuit of FIG. 6. During deactivation, the secondary FETs immediately experience a drop in amperage, while the commutation FETs experience an immediate increase in amperage as they shoulder the commutation stress of the circuit. Then, the commutation FETs experience a decrease in amperage after the secondary FETs are no longer experiencing amperage.

The foregoing description of preferred and other embodiments is not intended to limit or restrict the scope or applicability of the inventive concepts conceived of by the Applicants. In exchange for disclosing the inventive concepts contained herein, the Applicants desire all patent rights afforded by the appended claims. Therefore, it is intended that the appended claims include all modifications and alterations to the full extent that they come within the scope of the following claims or equivalents thereof.

What is claimed is:

1. A solid state relay circuit, comprising:
   a first FET group containing at least one commutation FET;
   a second FET group containing at least one secondary FET;
   said first and second FET groups being connected in parallel;
   said secondary FETs each having a lower resistance than each of said commutation FETs;
   said circuit configured such that when said circuit is activated said commutation FETs of said first FET group are driven on before said secondary FETs of said second FET group; and
   said circuit further configured such that when said circuit is deactivated said commutation FETs of said first FET group are driven off after said secondary FETs of said second FET group.

2. The circuit of claim 1 wherein said commutation FETs of said first FET group are each effective to tolerate the electrical stress caused by the activation and deactivation of said circuit.

3. The circuit of claim 1 wherein said commutation FETs of said first FET group are each effective to commute a maximum possible fault current of said circuit.

4. The circuit of claim 1 wherein said circuit is configured such that the delay of a gate drive causes said commutation FETs of said first FET group to be driven on before said secondary FETs of said second FET group when said circuit is activated and causes said commutation FETs of said first FET group to be driven off after said secondary FETs of said second FET group when said circuit is deactivated.

5. A solid state relay circuit, comprising
   at least one commutation FET connected in parallel to at least one secondary FET;
   a first delay device connected in series at a first end to a source of drive power and at a second end in series to said commutation FETs;
   a second delay device connected at a first end in series to a source of drive power and at a second end in series to said secondary FETs;
   said first and second delay devices effective in conjunction to cause said commutation FETs to be driven on before said secondary FETs when said circuit is activated and to cause said commutation FETs to be driven off after said secondary FETs when said circuit is deactivated.

6. The circuit of claim 5 wherein said first and second delay devices each comprise a resistor and a diode.

7. The circuit of claim 6 wherein said commutation FETs are each effective to tolerate the electrical stress caused by the activation and deactivation of said circuit.

8. The circuit of claim 5 wherein said commutation FETs are each effective to commute a maximum possible fault current of said circuit.

* * * * *